United States Patent
Peng et al.

(10) Patent No.: US 9,847,356 B2
(45) Date of Patent: Dec. 19, 2017

(54) DISPLAY ARRAY STRUCTURE HAVING EMBEDDED MAGNETIC FORCE GENERATOR AND ASSEMBLY METHOD THEREOF

(71) Applicant: Innolux Corporation, Miao-Li County (TW)

(72) Inventors: Jen-Chien Peng, Miao-Li County (TW); Chia-Hao Tsai, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/286,652

(22) Filed: Oct. 6, 2016

(65) Prior Publication Data

US 2017/0104009 A1 Apr. 13, 2017

(30) Foreign Application Priority Data

Oct. 9, 2015 (CN) .......................... 2015 1 0648262

(51) Int. Cl.
| | |
|---|---|
| H01L 27/12 | (2006.01) |
| H01L 27/32 | (2006.01) |
| H01L 29/45 | (2006.01) |
| H01L 51/52 | (2006.01) |

(52) U.S. Cl.
CPC ........ *H01L 27/124* (2013.01); *H01L 27/1259* (2013.01); *H01L 27/3276* (2013.01); *H01L 29/458* (2013.01); *H01L 51/5203* (2013.01)

(58) Field of Classification Search
CPC .............. H01L 27/1214; H01L 27/124; H01L 27/1251; H01L 41/125; G02F 2203/12; G02F 2203/09; G02F 1/0036; G02F 2202/36; G02F 1/091; B82Y 20/00
USPC .............................. 359/280; 345/111; 249/23
See application file for complete search history.

(56) References Cited

U.S. PATENT DOCUMENTS

2008/0198440 A1* 8/2008 Cho ........................ B82Y 20/00
359/280

* cited by examiner

*Primary Examiner* — Evan Pert
*Assistant Examiner* — Changhyun Yi
(74) *Attorney, Agent, or Firm* — Rabin & Berdo, P.C.

(57) ABSTRACT

An array substrate, a display apparatus applying the same and the assembly method thereof are provided, wherein the array substrate includes a substrate having a plurality of pixels, each of the pixels at least includes a thin film transistor (TFT) device, a first electrode, a second electrode separated from the first electrode all of which are disposed on the substrate. at least one of the first electrode and the second electrode is electrically contacted to the TFT device, and either the first electrode or the second electrode has a magnetic force generator used to generate a magnetic force substantially ranging from 10 gauss to 1000 gauss.

18 Claims, 12 Drawing Sheets

DISPLAY ARRAY STRUCTURE HAVING EMBEDDED MAGNETIC FORCE GENERATOR AND ASSEMBLY METHOD THEREOF

This application claims the benefit of People's Republic of China application Serial No. 201510648262.3, filed Oct. 9, 2015, the subject matter of which is incorporated herein by reference.

BACKGROUND

Field of the Invention

The disclosure relates in general to a substrate, a display apparatus applying the same and the assembly method thereof, and more particularly to an array substrate, a display apparatus applying the same and the assembly method thereof.

Description of the Related Art

With the development of electronic technology, the design trend of next-generation portable devices may focus on features of eco-friendly solutions, light weight, thin thickness, lower power consumption, higher resolution and higher performance. A thin film transistor liquid crystal display (TFT-LCD) having advantages of high luminous efficiency, long service life and durable has been broadly applied to the portable devices. However, because the response of liquid crystal molecules to an electric field is the major characteristic utilized in the TFT-LCD, and a backlight module used to provide light source is necessary to the operation of the TFT-LCD. The portable devices applying the TFT-LCD may not be so eco-friendly due to the use of the liquid crystal, and the dimension thereof may not be minimized due to the additional thickness of the backlight module.

Active-matrix organic light-emitting diode (AMOLED) displays that have advantages of high contrast, advanced visual angle, vivid color and high brightness have gained significant interest recently in display applications compared to liquid crystal displays (LCD). However, the evaporation process used to form the AMOLED displays still has some technical problems to be solved. Besides, the long-standing problems, including materials aging and non-uniform illumination, may also adversely affect the performance of the AMOLED displays. Such that, the process for fabricating the AMOLED displays may have poor yield and product reliability. In some cases, color excursion may occur on the end products of the AMOLED displays.

Therefore, there is a need of providing an improved array substrate, a display apparatus applying the same and the assembly method thereof to obviate the drawbacks encountered in the prior art.

SUMMARY

One embodiment of the disclosure is directed to an array substrate, wherein the array substrate includes a substrate having a plurality of pixels, each of the pixels at least includes a thin film transistor (TFT) device, a first electrode, a second electrode separated from the first electrode, all of which are disposed on the substrate. Either the first electrode or the second electrode is electrically connected to the TFT device, and at least one of the first electrode and the second electrode has a magnetic force generator used to generate a magnetic force substantially ranging from 10 gauss to 1000 gauss.

Another embodiment of the disclosure is directed to a display apparatus, wherein the display apparatus includes a substrate having a plurality of pixels and at least one light emitting diode (LED), at least one of the pixels includes a TFT device, a first electrode, a second electrode separated from the first electrode and all of which are disposed on the substrate. Either the first electrode or the second electrode is electrically connected to the TFT device. The LED has a third electrode electrically connected to the first electrode and a fourth electrode electrically connected to the second electrode. One of the first electrode and the third electrode has a magnetic force generator used to generate a magnetic force, and the other has a ferromagnetic material.

Yet another embodiment of the disclosure is directed to an assembly method of a display apparatus, wherein the assembly method includes steps as follows: An array substrate including a substrate having a plurality of pixels is provided, wherein at least one of the pixels includes a TFT device, a first electrode, a second electrode separated from the first electrode, all of which are disposed on the substrate, and either the first electrode or the second electrode is electrically connected to the TFT device. Next, at least one LED having a third electrode electrically connected to the first electrode and a fourth electrode electrically connected to the second electrode is provided, wherein one of the first electrode and the third electrode has a magnetic force generator used to generate a magnetic force ranging from 10 gauss to 1000 gauss, and the other has a ferromagnetic material.

In according to the aforementioned embodiments of the present disclosure, an array substrate, a display apparatus applying the same and the assembly method thereof are provided. A more eco-friendly display apparatus with high luminous efficiency and thin thickness is provided by applying surface mounting technology to assembly a plurality of LEDs onto an array substrate without applying liquid crystal molecule. Such that, the long-standing problems of the AMOLED displays, including materials aging, non-uniform illumination, poor yield and product reliability, can be obviated. In addition, since the LEDs and the array substrate are self-aligned by magnetic force formed there between, thus the process for assembling the same does not require an align mark. Whereby, the process for assembling the LEDs and the array substrate can be simplified and the manufacturing cost of the display apparatus could be reduced. In some embodiments, a pre-alignment step can be performed to improve the alignment accuracy between the LEDs and the array substrate by using a metal plate.

BRIEF DESCRIPTION OF THE DRAWINGS

The above and other aspects of the disclosure will become better understood with regard to the following detailed description but non-limiting embodiment(s). The following description is made with reference to the accompanying drawings.

DETAILED DESCRIPTION

The disclosure provides an array substrate, a display apparatus applying the same and the assembly method thereof to form a more eco-friendly display apparatus with high luminous efficiency and thin thickness and to obviate the long-standing problems of non-uniform illumination, poor yield and product reliability resulted from a conventional AMOLED display. To make the objects, technical features and advantages of the disclosure more apparent and easily understood, a number of exemplary embodiments are exemplified below with accompanying drawings.

It should be noted that the implementations and methods disclosed in the present disclosure are not for limiting the invention. The invention still can be implemented by using other features, elements methods and parameters. Exemplary embodiments are provided for illustrating the technical features of the invention, not for limiting the scope of protection of the invention. Any persons ordinarily skilled in the art can make suitable modifications and adjustments based on the description of the specification without breaching the spirit of the invention. Common reference designations are used throughout the drawings and embodiments to indicate the same elements.

Figure 1:
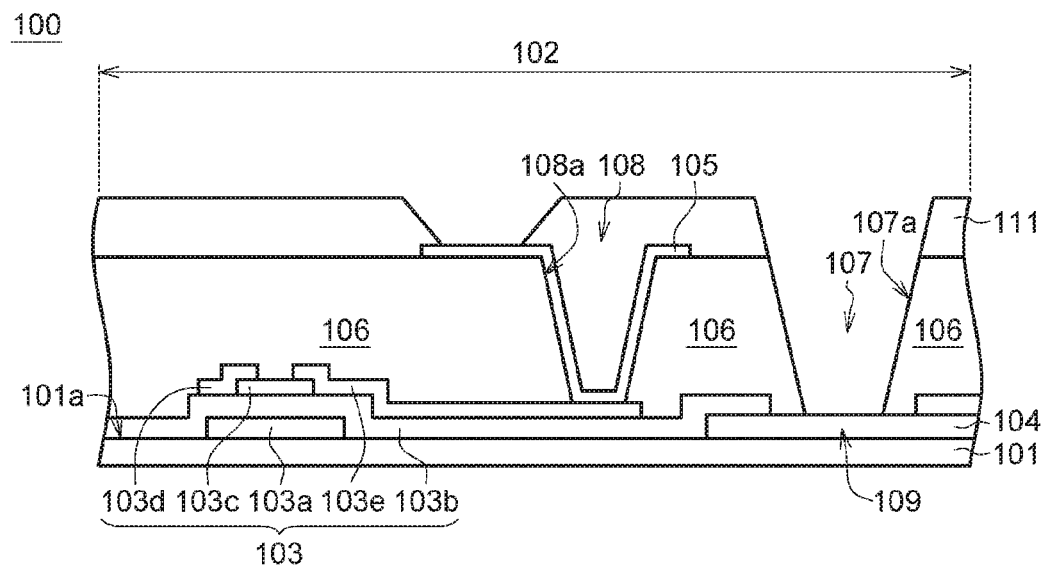
FIG. 1 is a cross-sectional view illustrating a portion of an array substrate in accordance with one embodiment of the present disclosure.

FIG. 1 is a cross-sectional view illustrating a portion of an array substrate 100 in accordance with one embodiment of the present disclosure. The array substrate 100 includes a substrate 101. In some embodiments of the present disclosure, the substrate 101 may be made of a transparent material, such as glass or flexible plastic material. The substrate 101 can include a plurality of pixels 102. For purpose of clear description, there is mere one pixel 102 depicted in FIG. 1, however, it is should be appreciated that the arrangement of the substrate 101 is not limited in this regard. In some other embodiments, the substrate 101 may have more than two pixels 102, and each two adjacent ones of these pixels 102 have a pitch ranging from 0.01 mm to 100 mm.

At least one of the plurality of pixels 102 may includes a TFT device 103, a first electrode 104, a second electrode 105 separated from the first electrode 104. In detail, the TFT device 103 includes a gate electrode 103a, a gate dielectric layer 103b, an active (channel) layer 103c, a source electrode 103d and a drain electrode 103e. In the present embodiment, the gate electrode 103a is disposed on a surface 101a of the substrate 101; the gate dielectric layer 103b is disposed on the gate electrode 103a; the active layer 103c is disposed on the gate dielectric layer 103b; and the source electrode 103d and the drain electrode 103e that are separated with each other are respectively disposed on and connected to the active layer 103c.

The first electrode 104 is disposed on the surface 101a of the substrate 101 and insulated from the TFT device 103. The array substrate 100 further includes an insulating layer 106 formed on the substrate 101 and covering on the TFT device 103 and a portion of the first electrode 104. The insulating layer 106 has a through hole 107 passing there through to define sidewalls 107a in the insulating layer 106 and to expose a portion of the first electrode 104.

The insulating layer 106 further has a through hole 108 passing there through to define sidewalls 108a in the insulating layer 106 and to expose a portion of the drain electrode 103e of the TFT device 103. The second electrode 105 is disposed on the insulating layer 106 and insulated from the first electrode 104. As shown in FIG. 1, at least one portion of the second electrode 105 extends into the through hole 108 to cover on the sidewalls 108a of the through hole 108 and to form an electrical contact with the drain electrode 103e of the TFT device 103.

A patterned dielectric protection layer 111 may be optionally formed on the insulating layer 106 and the second electrode 105 to fill the through hole 108 and to expose a portion of the first electrode 104 and a portion of the second electrode 105.

Figure 2:
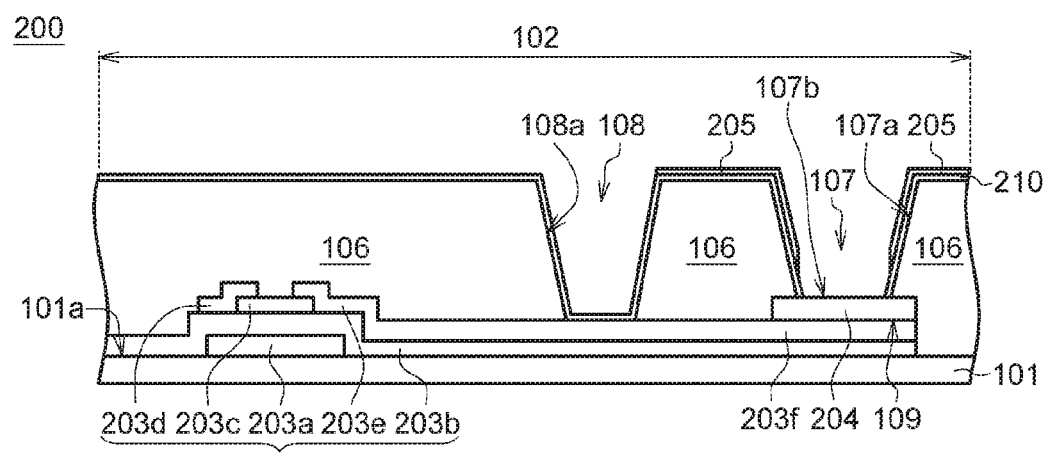
FIG. 2 is a cross-sectional view illustrating a portion of another array substrate in accordance with one embodiment of the present disclosure.

FIG. 2 is a cross-sectional view illustrating a portion of another array substrate 200 in accordance with one embodiment of the present disclosure. The structure of the array substrate 200 is similar to that of the array substrate 100 except that the array substrate 200 has an insulating layer 210 covering on the sidewalls 108a and the bottom of the through hole 108 as well as the portion of the drain electrode 203e exposed from the through hole 108, and the second electrode 205 is disposed on the insulating layer 210. Thus, there is no electrical contact formed between the TFT device 203 and the second electrode 205. As shown in FIG. 2, a portion of the first electrode 204 is exposed from the through hole 107, and an electrical contact is formed between the first electrode 204 and a extending portion 203f of the drain electrode 203e. In the present embodiment, at least one portion of the second electrode 205 extends into the through hole 107 to cover on the sidewalls 107a of the through hole 107 but there is no electrical contact formed between the second electrode 205 and the first electrode 204 that is exposed from the bottom 107b of the through hole 107.

In the embodiments depicted in FIGS. 1 and 2, either the first electrode or the second electrode has a magnetic force generator 109 used to generate a magnetic force substantially ranging from 10 gauss to 1000 gauss. For example, in the embodiment of FIG. 1, one of the first electrode 104 and the second electrode 105 or both of them have a magnetic material selected from a group consisting of iron oxide mineral magnetite ($Fe_3O_4$), aluminum-nickel-cobalt alloy, neodymium-iron-boron alloy ($Nd_2Fe_{14}B$), platinum (Pt), iron (Fe), neodymium (Nb), samarium (Sm), cobalt (Co), iron(III) oxide ($Fe_2O_3$), barium oxide (BaO), strontium oxide (SrO) and the arbitrary combinations thereof used to form a magnetic field there around. The magnetic field and magnetic force can be measured by a Gauss meter on the first electrode 104 or the second electrode 105.

Figure 3:
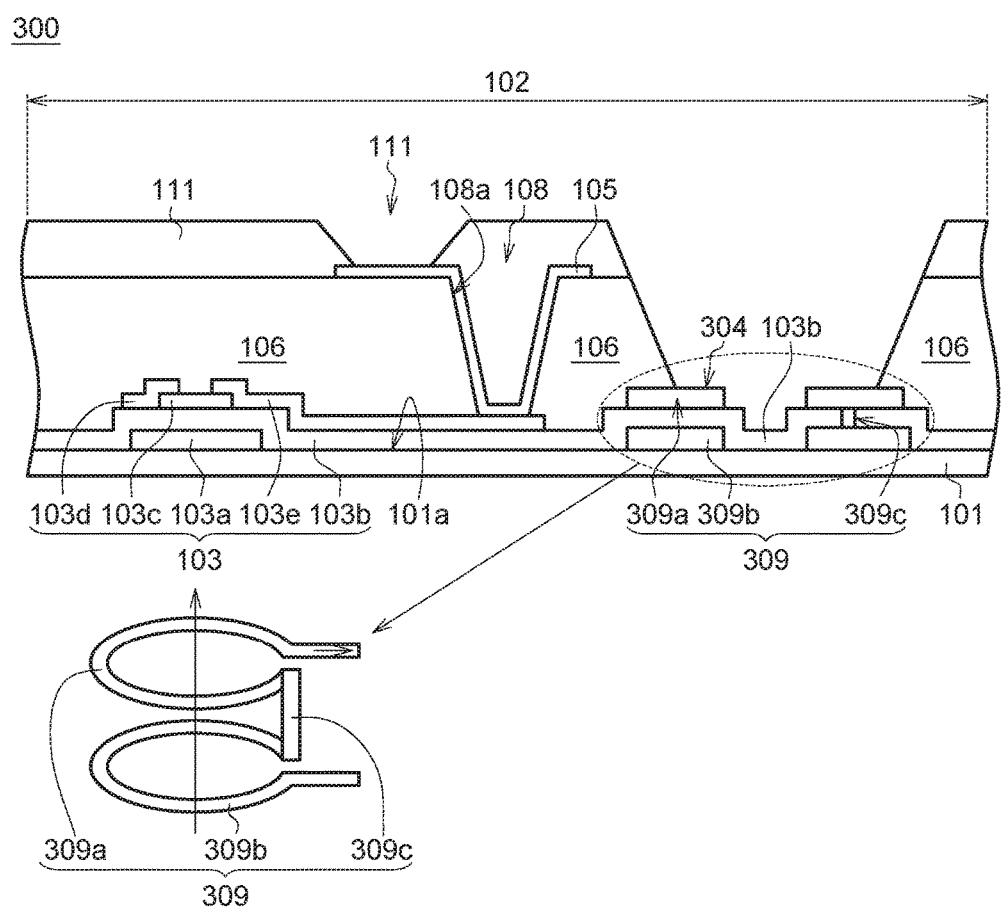
FIG. 3 is a cross-sectional view illustrating a portion of yet another array substrate in accordance with one embodiment of the present disclosure.

However, the structure of the magnetic force generator is not limited in this regard. FIG. 3 is a cross-sectional view illustrating a portion of yet another array substrate 300 in accordance with one embodiment of the present disclosure. The structure of the array substrate 300 is similar to that of the array substrate 100 except that the array substrate 300 has a different magnetic force generator 309.

In some embodiments of the present disclosure, the magnetic force generator 309 at least includes a first coil 309a and a second coil 309b electrically connected to the first coil 309a, wherein the magnetic force generator 309 can be connected to an external power source (not shown) to form a electromagnet structure. In the present embodiment, the first coil 309a and the second coil 309b can be constituted by two ring-shaped metal layers, and the orthogonal projections of the first coil 309a and the second coil 309b formed on the substrate 101 may at least partially overlap. In another embodiment, the first coil 309a and the second coil 309b have a common axis. In detail, a dielectric layer 103b is between the first coil 309a and the second coil 309b, meanwhile the first coil 309a is electrically connected to the second coil 309b by a via plug 309c passing through the dielectric layer 103b. When current I passing through the first coil 309a, the second coil 309b and the via plug 309c, magnetic field and magnetic force can be formed there around. In another embodiment, the first coil 309a, the second coil 309b and the via plug 309c are made of the same material. It should be appreciated that the structure of the magnetic force generator 309 is not limited in this regard, nevertheless there depicts mere may two coils in FIG. 3. In some other embodiments, the magnetic force generator 309 can include more coils electrically connected with each other. In addition, the shape of the coils is not limited to a round shape, any type of ring-shape structure (such as a polygonal annular shaped structure) may be suitable for use as the coil without breaching the spirit of the invention.

Figure 4A:
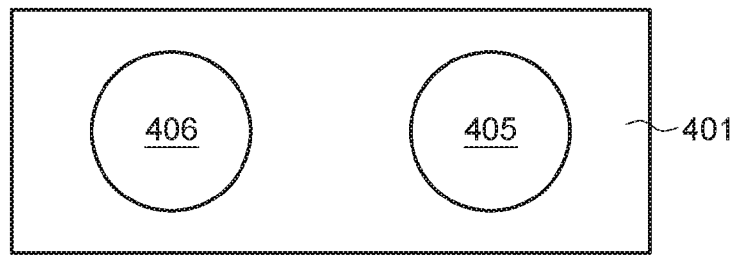
FIGS. 4A to 4C are partial top views illustrating different kinds of LEDs in accordance with different embodiments of the present disclosure.
Figure 4B:
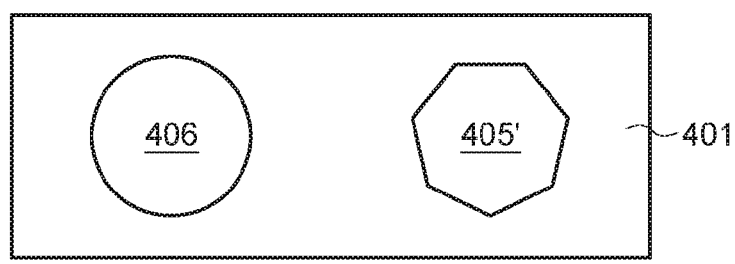
Figure 4C:
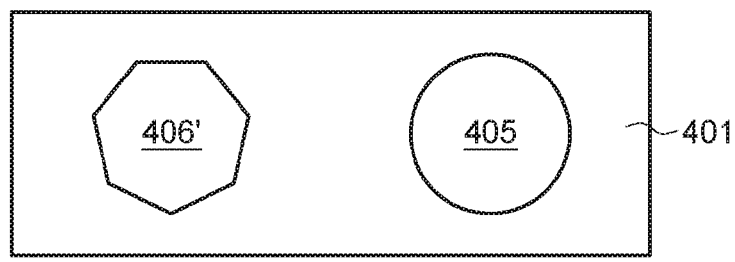
Figure 4:
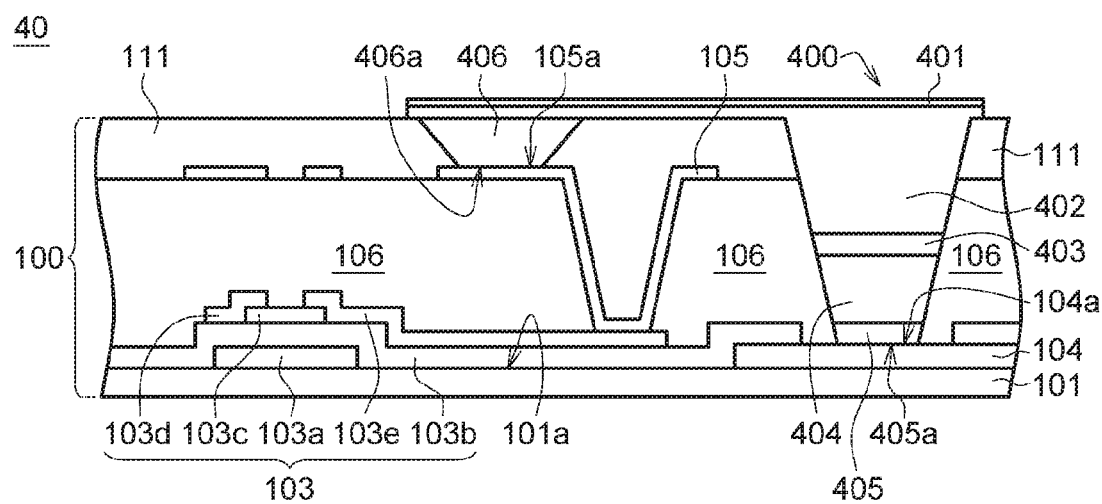
FIG. 4 is a cross-sectional view illustrating a portion of a display apparatus in accordance with one embodiment of the present disclosure.

A display apparatus can be implemented by assembling a plurality of LEDs onto one of the array substrates 100, 200 and 300 respectively depicted in FIGS. 1 to 3. For example, FIG. 4 is a cross-sectional view illustrating a portion of a display apparatus 40 in accordance with one embodiment of the present disclosure. In the present embodiment, the display apparatus 40 is formed by mounting at least one LED 400 onto the array substrate 100 of FIG. 1.

The LED 400 includes a base board (such as an alumina base board) 401, a first semiconductor layer 402 with a first conductivity (such as an n-type gallium nitride layer), an active layer 403, a second semiconductor layer 404 with a second conductivity (such as a p-type gallium nitride layer), a third electrode 405 and a fourth electrode 406. The first semiconductor layer 402, the active layer 403 and the second semiconductor layer 404 are stacked in sequence on the base board 401; the third electrode 405 is disposed on and electrically connected to the second semiconductor layer 404; and the fourth electrode 406 is disposed on and electrically connected to the first semiconductor layer 402.

When the LED 400 is mounted onto the array substrate 100, the third electrode 405 is electrically connected to the first electrode 104, and the fourth electrode 406 is electrically connected to the second electrode 105. In the present embodiment, the first electrode 104 includes a magnetic material, and the third electrode 405 includes a ferromagnetic material, wherein the ferromagnetic material is selected from a group consisting of Fe, Co, nickel (Ni) and the arbitrary combinations thereof. The first electrode 104 and the third electrode 405 can be aligned and assembled by the magnetic force generated between the magnetic material of the first electrode 104 and the ferromagnetic material of the third electrode 405 without using an align mark during the mounting process.

In some embodiments of the present disclosure, the second electrode 105 may also include the magnetic material, and the fourth electrode 406 may also include the ferromagnetic material. However, in the present embodiment, only the first electrode 104 includes the magnetic material, and only the third electrode 405 corresponding to the first electrode 104 includes the ferromagnetic material. The second electrode 105 and the fourth electrode 406 neither include the magnetic material nor the ferromagnetic material. In yet other embodiments, only the first electrode 104 includes the ferromagnetic material, and only the third electrode 405 corresponding to the first electrode 104 includes the magnetic material. But the arrangements of the ferromagnetic material and the magnetic material are not limited in this regards. In sum, at least one of the first electrode 104, the second electrode 105, the third electrode 405 and the fourth electrode 406 includes the magnetic material, and the corresponding one may include the ferromagnetic material.

In order to improve the bonding strength between the LED 400 and the array substrate 100, the third electrode 405 and the fourth electrode 406 may be designed in various shapes and dimensions. For example, the top surface 104a of the first electrode 104 may be designed as having a surface area substantially greater than or equal to a surface area of the top surface 405a of the third electrode 405; and the top surface 105a of the second electrode 105 may be designed as having a surface area substantially greater than or equal to a surface area of the top surface 406a of the fourth electrode 406.

In some embodiments of the present disclosure, the third electrode 405 and the fourth electrode 406 of the LED 400 both have a circular cross-sectional profile (see FIG. 4A) in top view. In some other embodiments, the third electrode 405' of the LED 400' may have a polygon-shaped profile (such as a hexagon-shaped profile) or a regular-shaped/irregular-shaped profile other than the polygon-shaped profile, and the fourth electrode 406' of the LED 400' may have a circular profile (see FIG. 4B). In yet other embodiments, the fourth electrode 406" of the LED 400" may have a polygon-shaped profile (such as a hexagon-shaped profile) or a regular-shaped/irregular-shaped profile other than the polygon-shaped profile, and the third electrode 405" of the LED 400" may have a circular profile (see FIG. 4C). In yet other embodiments, both the third electrode and the fourth electrode have a polygon-shaped profile, such as triangle-shaped, quadrangle-shaped or hexagon-shaped profile, or a regular-shaped/irregular-shaped profile (not shown) other than the polygon-shaped profile in top view.

In some embodiments of the present disclosure, the display apparatus 40 may further include at least one data line (not shown) and at least one scan line (not shown), wherein the scan line is electrically connected to the gate electrode 103a of the TFT device 103; the data line is electrically connected to the source electrode 103d of the TFT device 103; and the first electrode 104 may serve as the common electrode of the display apparatus 40. In another embodiment, the first electrode 104 and the gate electrode 103a are formed by the same process.

In some embodiments of the present disclosure, various types of display apparatus can be obtained by assembling different types of LEDs with different types of the array substrate. For example, FIG. 5 is a cross-sectional view illustrating a portion of another display apparatus 50 in accordance with one embodiment of the present disclosure. In the present embodiment, the display apparatus 50 is formed by mounting at least one LED 500 onto the array substrate 200 of FIG. 2.

The LED 500 includes a base board (such as an alumina base board) 501, a first semiconductor layer 502 with a first conductivity (such as an n-type gallium nitride layer), an active layer 503, a second semiconductor layer 504 with a second conductivity (such as a p-type gallium nitride layer), a third electrode 505 and a fourth electrode 506. The first semiconductor layer 502, the active layer 503 and the second semiconductor layer 504 are stacked in sequence on the base board 501; the third electrode 505 is disposed on and electrically connected to the top surface 504a of the second semiconductor layer 504; and the fourth electrode 506 is electrically connected to the first semiconductor layer 502 and extends towards on the sidewalls of the stack structure 507 constituted by the first semiconductor layer 502, the active layer 503 and the second semiconductor layer 504, wherein the fourth electrode 506 is electrically insulated from the active layer 503 and the second semiconductor layer 504 by an insulating layer 509.

Figure 5A:
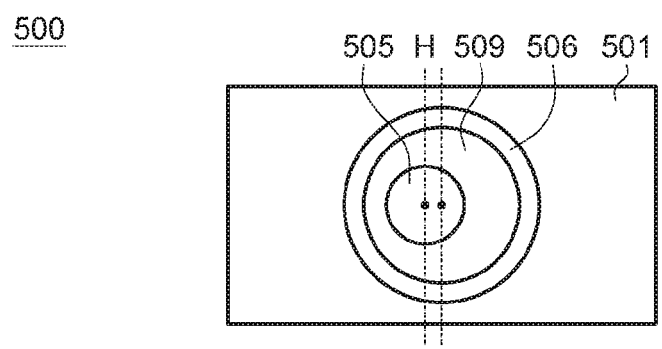
FIGS. 5A and 5B are partial top views respectively illustrating different kinds of LEDs applied in the display apparatus depicted in FIG. 5.
Figure 5B:
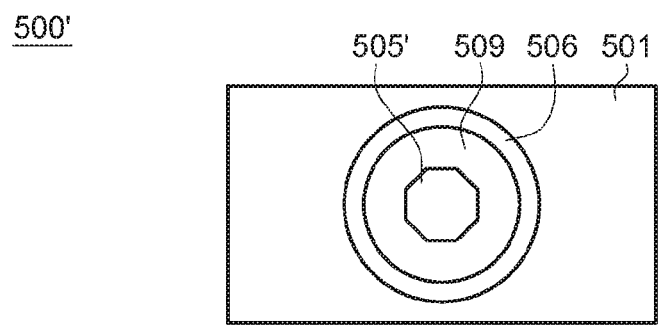
Figure 5:
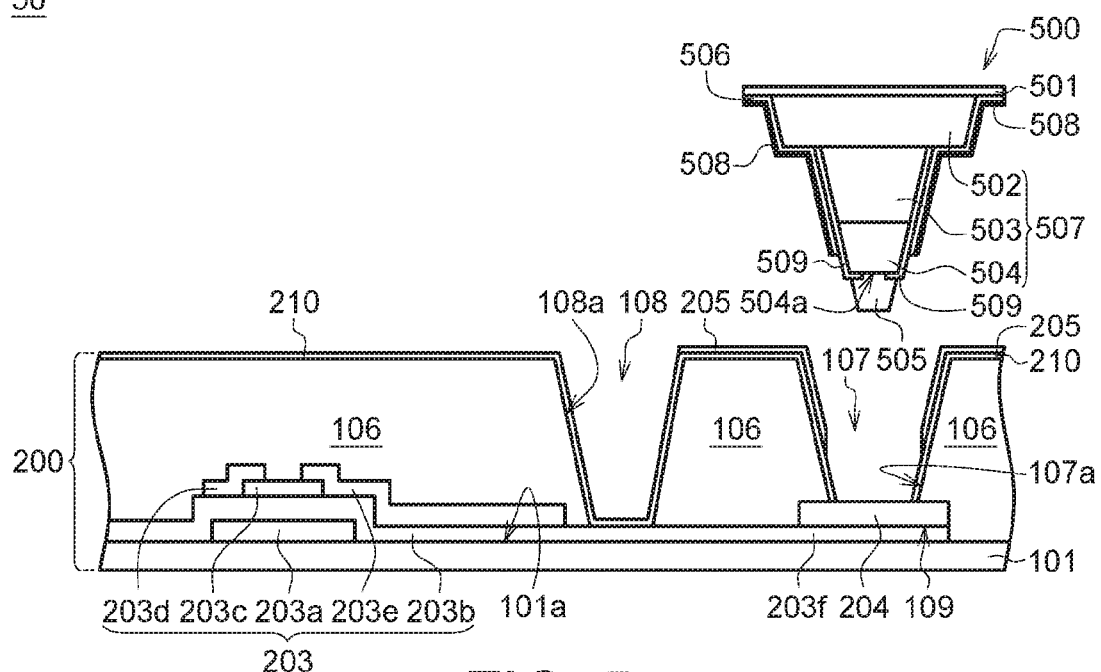
FIG. 5 is a cross-sectional view illustrating a portion of another display apparatus in accordance with one embodiment of the present disclosure.

FIGS. 5A and 5B are partial top views respectively illustrating different kinds of LEDs 500 and 500' applied in the display apparatus depicted 50 in FIG. 5. As shown in FIGS. 5A and 5B, the fourth electrode 506 of either the LED 500 or the LED 500' is a continuous ring-shaped structure surrounding the stack structure 507. The fourth electrode 506 has an orthogonal projection formed on the substrate 101 surrounding the orthogonal projection of the third electrode 505(505') formed on the substrate 101, wherein the orthogonal projections of the fourth electrode 506 and the third electrode 505 respectively have a geometric center formed on the substrate 101, and the distance between these two geometric centers may be greater than 0. However, in some other embodiments, the distance between these two geometric centers of the orthogonal projections of the fourth electrode 506 and the third electrode 505 formed on the substrate 101 may be equal to 0.

When the LED 500 is mounted onto the array substrate 200, the first electrode 204 of the array substrate 200 is electrically connected to the third electrode 505, and the portion of the fourth electrode 506 disposed on the sidewalls of the stack structure 507 is electrically connected to the portion of the second electrode 205 extending to cover on the sidewall 107a of the insulating layer 106. In the present embodiment, after the electrical connection between the first electrode 204 and the third electrode 505 as well as the electrical connections between the second electrode 205 and the fourth electrode 506 are formed, an adhesive 508 (such as silver adhesive, soft solder or isotropic conductive adhesive) may be applied to the interface formed between the first electrode 204 and the third electrode 505 and/or applied to the interface formed between the second electrode 205 and the fourth electrode 506 to increase the bonding strength thereof.

In order to improve the bonding strength between the LED 500 and the array substrate 200, the third electrode 505 may be designed in various shapes. FIG. 5B is a partial top view illustrating another LED 500' applied in the display apparatus depicted in FIG. 5. The third electrode 505' of the LED 500' may (but not limited to) have a hexagon-shaped profile in top view.

Figure 6A:
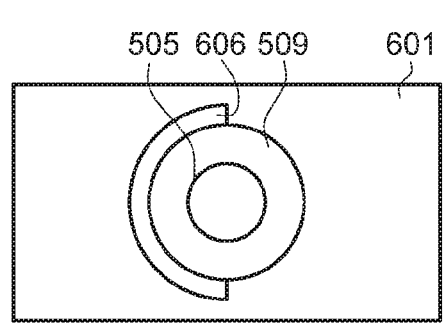
FIG. 6A is a partial top view illustrating the LED applied by the display apparatus depicted in FIG. 6.
Figure 6:
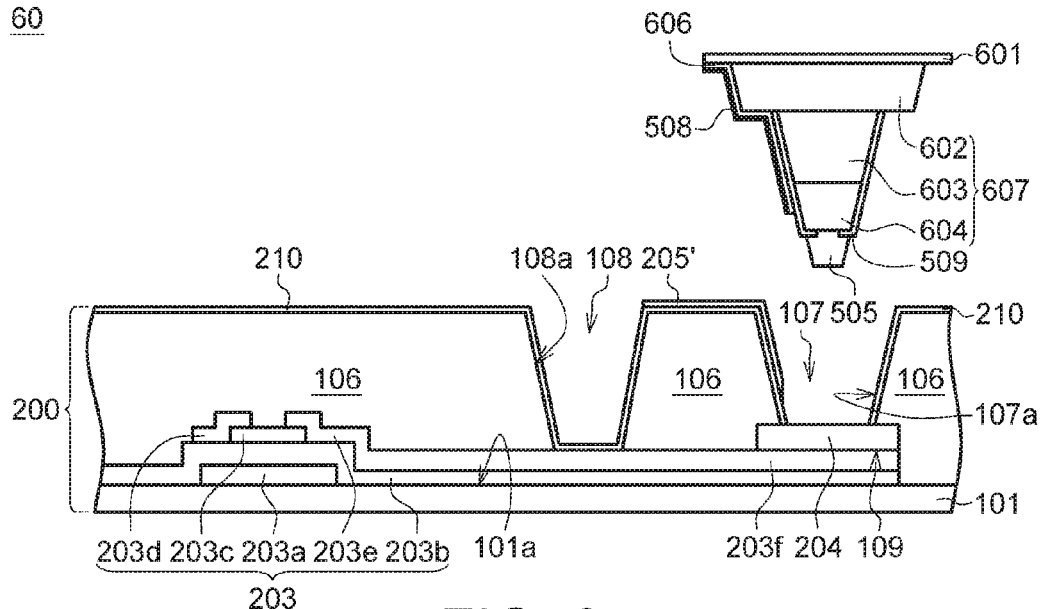
FIG. 6 is a cross-sectional view illustrating a portion of yet another display apparatus in accordance with one embodiment of the present disclosure.

FIG. 6 is a cross-sectional view illustrating a portion of yet another display apparatus 60 in accordance with one embodiment of the present disclosure; and FIG. 6A is a partial top view illustrating the LED 600 applied by the display apparatus 60 depicted in FIG. 6. The structure of the display apparatus 60 is similar to that of the display apparatus 50 depicted in FIG. 5 except that the display apparatus 60 has a different fourth electrode 606. The fourth electrode 606 of the LED 600 is a non-continuous ring-shaped structure partially surrounding the stack structure 607 constituted by the first semiconductor layer 602, the active layer 603 and the second semiconductor layer 604. The second electrode 205' of the array substrate 200 also extends into the through hole 107 to cover on the sidewalls 107a of the insulating layer 106. Any structure that can make the fourth electrode 606 of the LED 600 electrically connected to the second electrode 205' of the array substrate 200 may be suitable for use in the disclosure.

Figure 7:
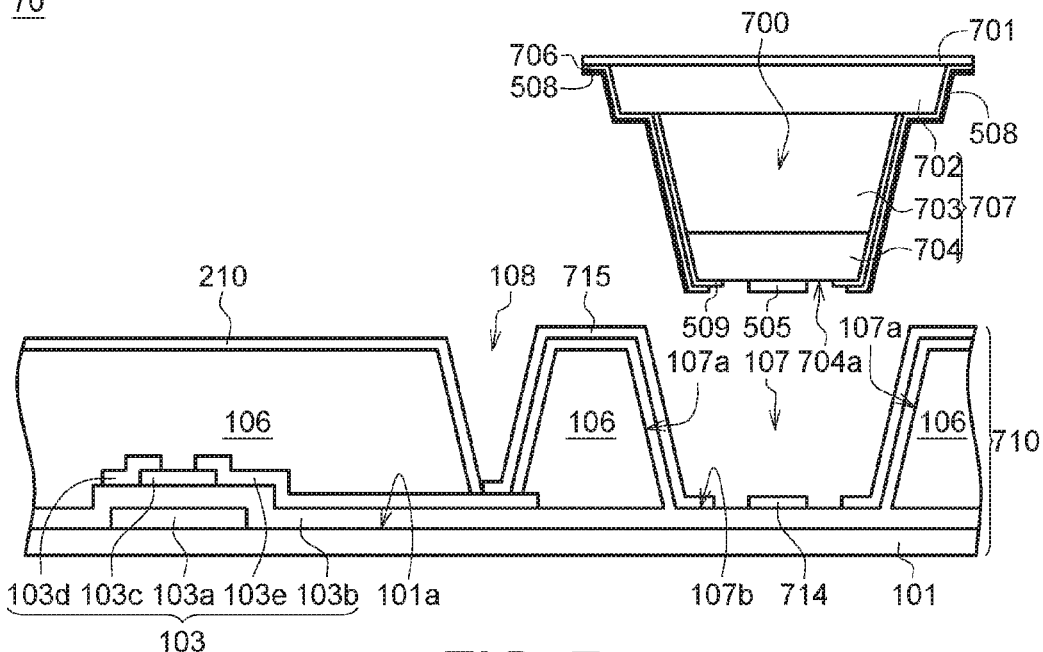
FIG. 7 is a cross-sectional view illustrating a portion of yet another display apparatus in accordance with one embodiment of the present disclosure.

FIG. 7 is a cross-sectional view illustrating a portion of yet another display apparatus 70 in accordance with one embodiment of the present disclosure. The structure of the display apparatus 70 is similar to that of the display apparatus 50 depicted in FIG. 5 except the structure of the second electrode 715.

In the present embodiment, the portion of the second electrode 715 of the array substrate 710 extending into the through hole 107 not only covers on the sidewalls 107a of the insulating layer 106 but also covers on the edge portions of the bottom of through hole 107. However, the extending portion of the second electrode 715 is electrically insulated from the first electrode 714. The fourth electrode 706 of the LED 700 is disposed on the sidewalls of the stack structure 707 constituted by the first semiconductor layer 702, the active layer 703 and the second semiconductor layer 704. A portion of the fourth electrode 706 extends to the top surface 704a of the second semiconductor layer 704. However, the fourth electrode 706 is electrically insulated from the active layer 703 and the second semiconductor layer 704 by an insulating layer 509.

When the LED 700 is mounted onto the array substrate 710, the portion of the fourth electrode 706 disposed on the sidewalls of the stack structure 707 can be electrically connected to the portion of the second electrode 715 covering on the sidewalls 107a of the insulating layer 106, and another portion of the fourth electrode 706 disposed on the top surface 704a of the second electrode 704 can be electrically connected to the portion of the second electrode 715 covering on the edge portions of the bottom of through hole 107. Such that the contact resistance between existing between the fourth electrode 706 and the second electrode 715 can be reduced significantly and the luminous efficiency of the LED 700 can be improved.

Figure 8:
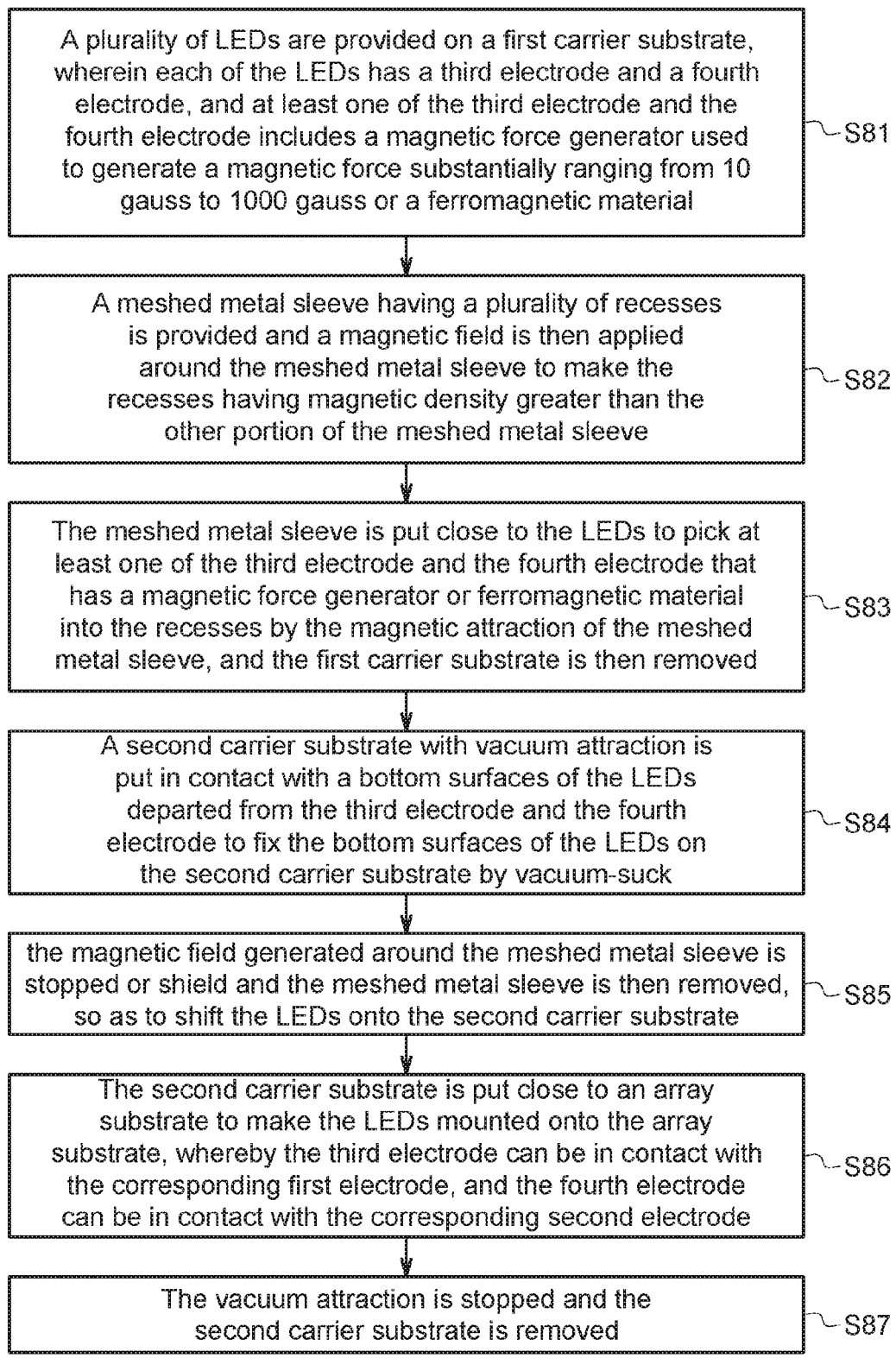
FIG. 8 is a process flow diagram illustrating a method for assembling a display apparatus in accordance with one embodiment of the present disclosure.
Figure 8A:
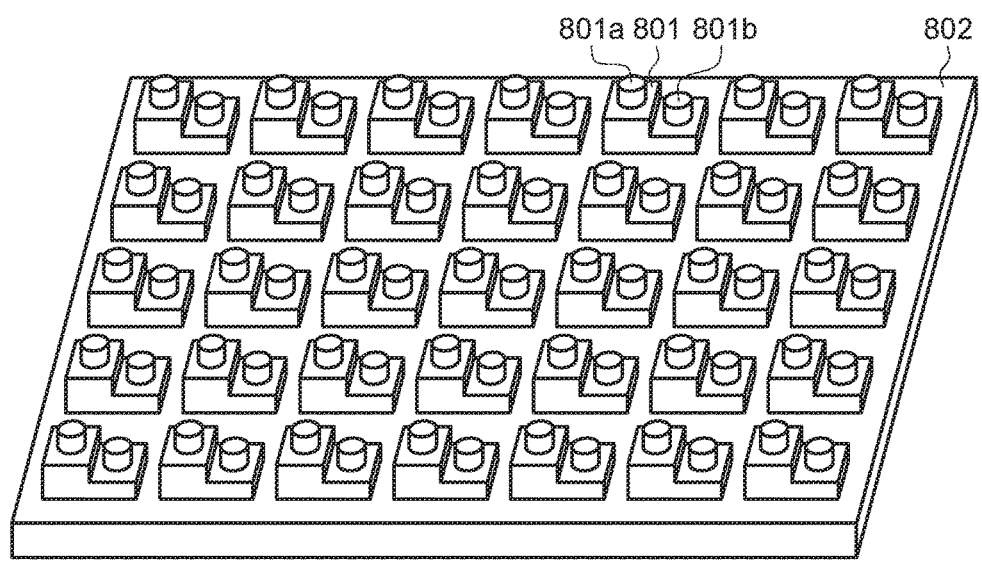
FIGS. 8A and 8F illustrate a series of process structures for fabricating the display apparatus depicted in FIG. 8.
Figure 8B:
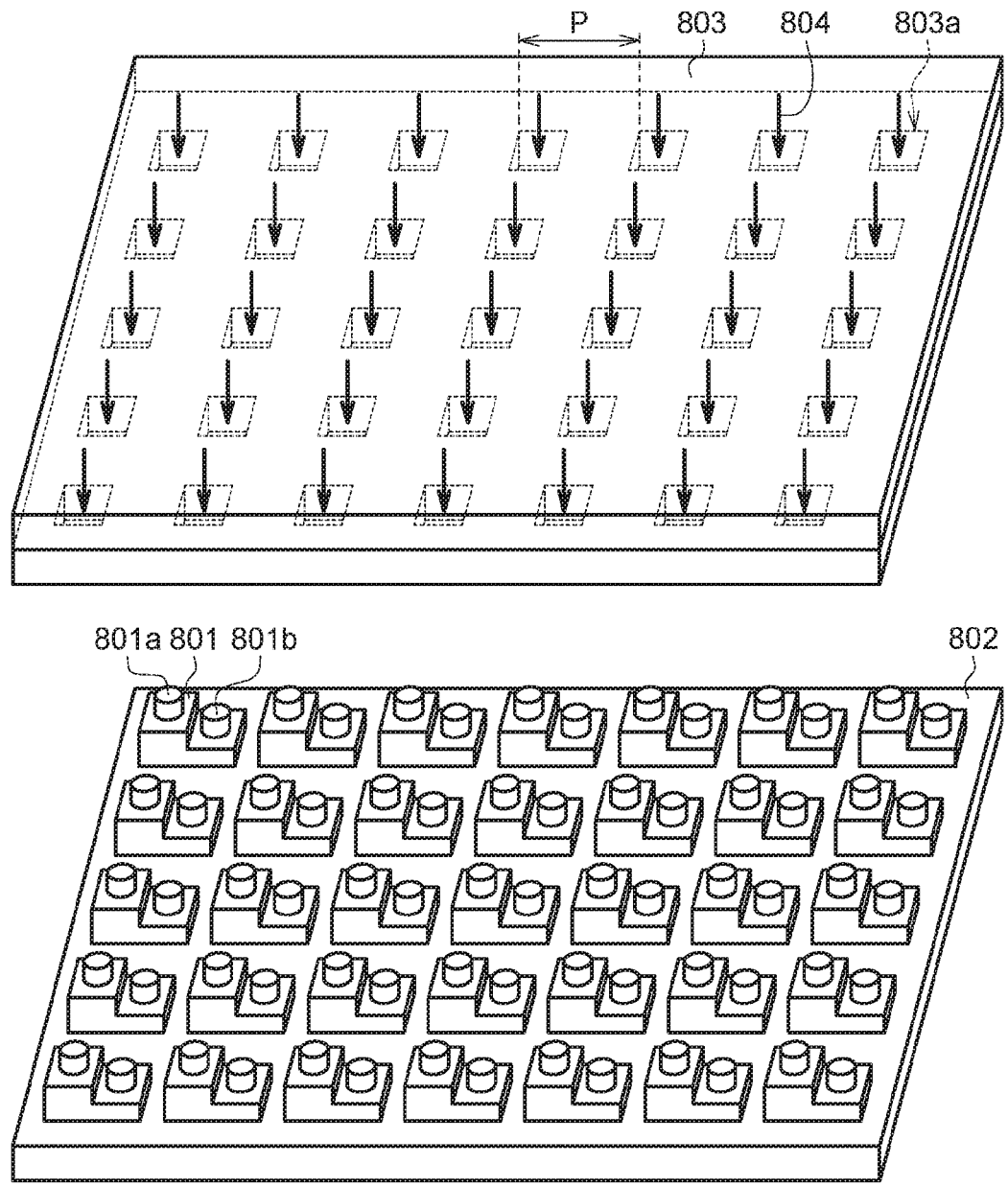

FIG. 8 is a process flow diagram illustrating a method for assembling a display apparatus 80 in accordance with one embodiment of the present disclosure. FIGS. 8A and 8F illustrate a series of process structures for fabricating the display apparatus depicted in FIG. 8. The method for assembling the display apparatus 80 includes steps as follows: Regard to step S81, a plurality of LEDs, such as LEDs 801, are provided on a first carrier substrate 802, wherein each of the LEDs 801 has a third electrode 801a and a fourth electrode 801b, and at least one of the third electrode 801a and the fourth electrode 801b includes a ferromagnetic material or a magnetic force generator used to generate a magnetic force substantially ranging from 10 gauss to 1000 gauss or ferromagnetic material.

As shown in FIG. 8A, the LEDs 801 that are placed on a first carrier substrate 802 can be arranged to form (but not limited to) a chessboard array.

Regard to step S82, a metal plate 803 having a plurality of recesses 803a is provided and magnetic field 804 is then generated around the metal plate 803 (e.g. by applying current to the metal plate 803) to make the recesses 803a having magnetic flux density greater than the other portions of the metal plate 803. Two adjacent recesses 803a of the metal plate 803 have a pitch ranging from 0.01 mm to 100 mm. The number of the LEDs 801 placed on a first carrier substrate 802 and the arrangement thereof is not limited to must match the number and the arrangement of the recesses 803a of the metal plate 803.

Regard to step S83, the metal plate 803 is then put close to the LEDs 801 that are placed on the first carrier substrate 802 to pick at least one of the LEDs 801, the at least one of the LEDs 801 has one of the third electrode 801a and the fourth electrode 801b with a magnetic force generator or ferromagnetic material is attracted into the recesses 803a by the magnetic attraction of the metal plate 803. Thereafter, the first carrier substrate 802 is removed.

Figure 8C:
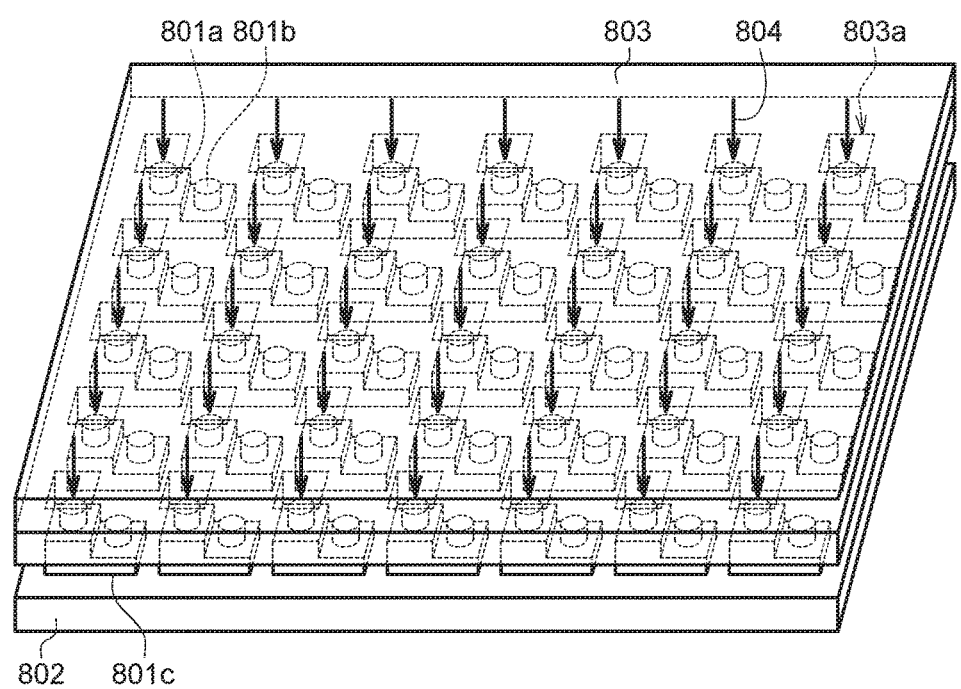

In the present embodiment, as shown in FIG. 8C, since mere the third electrode 801a of the at least one of the LEDs 801 has a magnetic force generator that can form a paramagnetism identical to the magnetic field 804 or has a ferromagnetic material that can be attracted by the magnetic force of metal plate 803, thus only the third electrode 801a can be pick into the corresponding recess 803a.

Figure 8D:
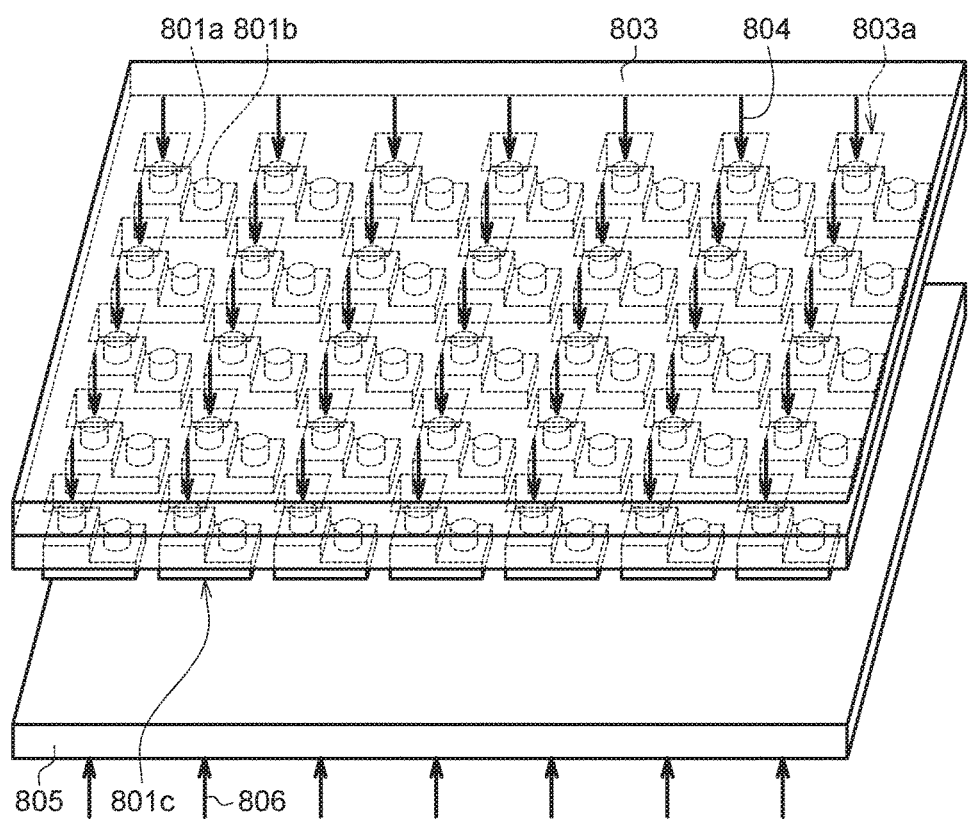

Next regard to step S84, a second carrier substrate 805 with vacuum attraction 806 is put close to a bottom surfaces 801c of the LEDs 801 departed from the third electrode 801a and the fourth electrode 801b, and to fix the bottom surfaces 801c of the LEDs 801 on the second carrier substrate 805 by vacuum-suck (see FIG. 8D).

Figure 8E:
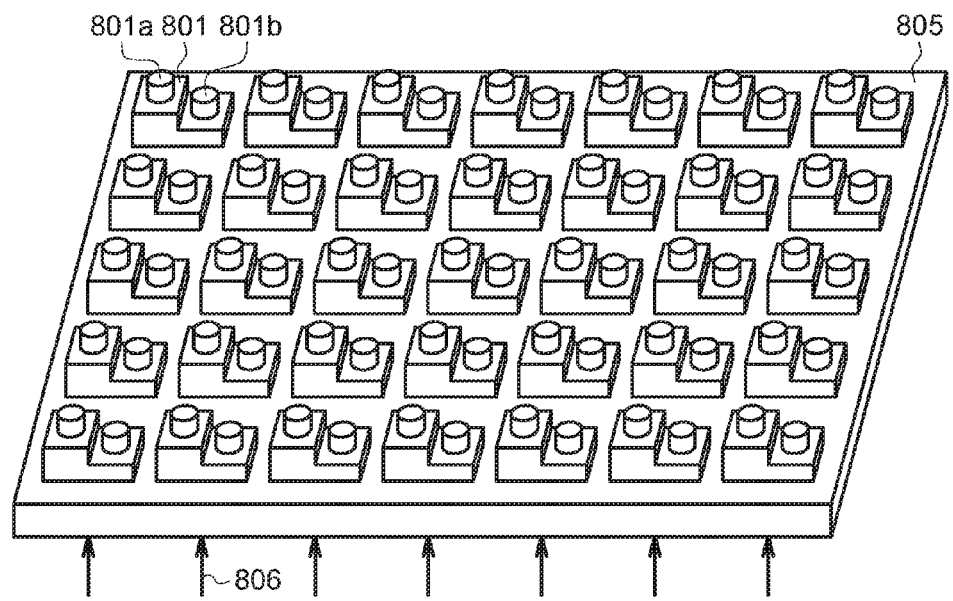
Figure 8F:
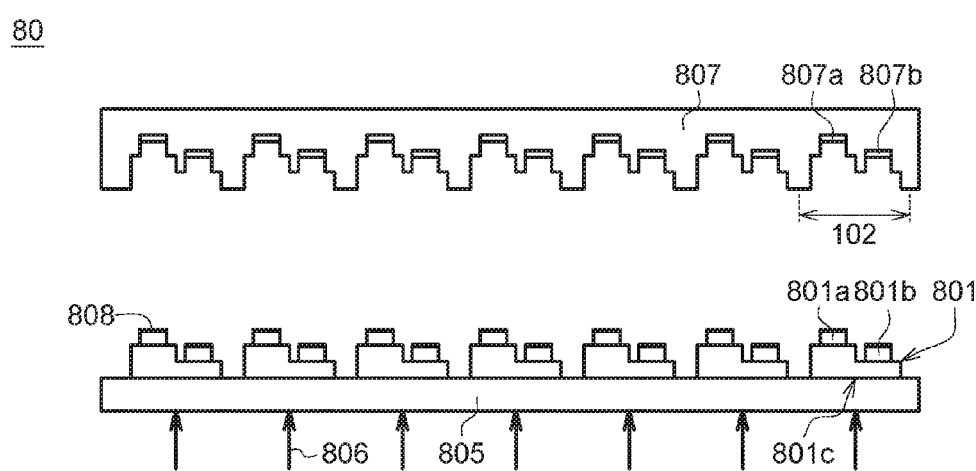

Thereafter, regard to step S85, the magnetic field 804 generated around the metal plate 803 is stopped or shielded and the metal plate 803 is then removed, whereby the LEDs 801 can be shifted onto the second carrier substrate 805 (see FIG. 8E).

Subsequently, regard to step S86, the second carrier substrate 805 is put close to an array substrate 807, wherein the third electrode 801a of the at least one of the LEDs 801 can corresponds to the first electrode 807a of the array substrate 807, and the fourth electrode 801b of the at least one of the LEDs 801 can corresponds to the second electrode 807b of the array substrate 807 (see FIG. 8F). In some embodiments of the present disclosure, an adhesive 808 can be applied to the interface formed between the first electrode 807a and the third electrode 801a and/or applied to the interface formed between the second electrode 807b and the fourth electrode 801b to increase the bonding strength thereof. It should be appreciated that the connection of the third electrodes 801a and the first electrodes 807a as well as the connection of the fourth electrodes 801b and the second electrodes 807b are not limited in this regard. In some other embodiments, when the adhesive 808 is applied to the aforementioned interfaces, the third electrode 801a of the at least one of the LEDs 801 may not be directly contacted to the corresponding first electrode 807a of the array substrate 807, and the fourth electrode 801b of the at least one of the LEDs 801 may not be directly contacted to the corresponding second electrode 807b of the array substrate 807. Regard to step S87, after the vacuum attraction 806 is stopped and the second carrier substrate 805 is removed, a series backend process, such as the steps for forming interconnections, optical films, and so on, are performed, meanwhile the display apparatus 80 is accomplished.

In the present embodiment, the first electrode 807a of the array substrate 807 includes a magnetic force generator or a ferromagnetic material, and the corresponding third electrode 801a of the at least one of the LEDs 801 includes a ferromagnetic material or a magnetic force generator. The first electrode 807a and the third electrode 801a can be aligned and assembled by the magnetic force generated between the first electrode 807a and the third electrode 801a. In addition, since a pre-alignment step can be performed prior to the assembling of the array substrate 807 and the LEDs 801 by using the metal plate 803, thus the alignment accuracy between the LEDs 801 and the array substrate 807 can be more improved.

In according to the aforementioned embodiments of the present disclosure, an array substrate, a display apparatus applying the same and the assembly method thereof are provided. A more eco-friendly display apparatus with high luminous efficiency and thin thickness is provided by applying surface mounting technology to assembly a plurality of LEDs onto an array substrate without applying liquid crystal molecule. Such that, the long-standing problems of AMO-LED displays, including materials aging, non-uniform illumination, poor yield and product reliability, can be obviated.

In addition, since the LEDs and the array substrate could be aligned by magnetic force formed there between, the process for assembling the LEDs and the array substrate can be simplified and the manufacturing cost of the display apparatus can be reduced. In some embodiments, a pre-alignment step can be performed to improve the alignment accuracy between the LEDs and the array substrate by using a metal plate.

While the invention has been described by way of example and in terms of the embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. An array substrate, comprising:
a substrate having a plurality of pixels, wherein at least one of the plurality of pixels comprising:
a thin film transistor (TFT) device, disposed on the substrate;
a first electrode, disposed on the substrate; and
a second electrode disposed on the substrate and separated from the first electrode;
wherein one of the first electrode and the second electrode is electrically connected to the TFT device, and at least one of the first electrode and the second electrode has a magnetic force generator to generate a magnetic force substantially within a range from 10 gauss to 1000 gauss;
wherein the magnetic force generator comprises:
a first coil; and
a second coil electrically connected to the first coil; and
wherein the first coil has a first orthogonal projection formed on the substrate, the second coil has a second orthogonal projection formed on the substrate, and the first orthogonal projection and the second orthogonal projection are at least partially overlapped.

2. The array substrate according to claim 1, wherein the magnetic force generator comprises a magnetic material selected from a group consisting of iron oxide mineral magnetite ($Fe_3O_4$), aluminum-nickel-cobalt alloy, neodymium-iron-boron alloy ($Nd_2Fe_{14}B$), platinum (Pt), iron (Fe), neodymium (Nb), samarium (Sm), cobalt (Co), iron (III) oxide ($Fe_2O_3$), barium oxide (BaO), strontium oxide (SrO) and the arbitrary combinations thereof.

3. The array substrate according to claim 1, further comprising an insulating layer disposed on the substrate and having a through hole used to expose at least a portion of the first electrode, a sidewall of the insulating layer corresponding to the through hole, and the second electrode covers at least partial of the sidewall.

4. A display apparatus, comprising:
a substrate having a plurality of pixels, wherein at least one of the plurality of pixels comprising:
a TFT device, disposed on the substrate;
a first electrode, disposed on the substrate; and
a second electrode disposed on the substrate and separated from the first electrode, wherein one of the first electrode and the second electrode is electrically connected to the TFT device; and
an LED having a third electrode electrically connected to the first electrode and a fourth electrode electrically connected to the second electrode; wherein only one of the first electrode and the third electrode has a magnetic force generator, and only one of the first electrode and the third electrode has a ferromagnetic material.

5. The display apparatus according to claim 4, wherein the magnetic force generator is used to generate a magnetic force substantially ranging from 10 gauss to 1000 gauss.

6. The display apparatus according to claim 4, further comprising:
a scan line electrically connected to a gate electrode of the TFT device; and
a data line electrically connected to a source electrode of the TFT device, wherein the second electrode is electrically connected to a drain electrode of the TFT, and the first electrode serves as a common electrode of the display apparatus.

7. The display apparatus according to claim 4, wherein the fourth electrode does not comprise the ferromagnetic material and a magnetic material.

8. The display apparatus according to claim 4, further comprising an adhesive disposed between the first electrode and the third electrode or between the second electrode and the fourth electrode.

9. The display apparatus according to claim 4, wherein the magnetic force generator comprises a magnetic material selected from a group consisting of $Fe_3O_4$, aluminum-nickel-cobalt alloy, $Nd_2Fe_{14}B$, Pt, Fe, Nb, Sm, Co, $Fe_2O_3$, BaO, SrO and the arbitrary combinations thereof.

10. The display apparatus according to claim 4, wherein the ferromagnetic material is selected from a group consisting of Fe, Co, nickel (Ni) and the arbitrary combinations thereof.

11. The display apparatus according to claim 4, wherein the magnetic force generator comprises:
a first coil; and
a second coil electrically connected to the first coil;
wherein the first coil has a first orthogonal projection formed on the substrate, the second coil has a second orthogonal projection formed on the substrate, and the first orthogonal projection and the second orthogonal projection are at least partially overlapped with each other.

12. The display apparatus according to claim 4, in a top view, wherein the fourth electrode is a continuous ring-shaped structure surrounding the third electrode or a non-continuous ring-shaped outside the third electrode.

13. The display apparatus according to claim 12, wherein the fourth electrode and the third electrode respectively have a geometric center, and the distance between the geometric center of the third electrode and the geometric center of the fourth electrode is greater than 0.

14. The display apparatus according to claim 4, wherein the first electrode has a first top surface with a surface area substantially greater than or equal to a surface area of a second top surface of the third electrode.

15. An assembly method of a display apparatus, comprising:
providing an array substrate, wherein the array substrate comprises:
a substrate, having a plurality of pixels, wherein at least one of the plurality of pixels comprising:
a TFT device, disposed on the substrate;
a first electrode, disposed on the substrate; and
a second electrode disposed on the substrate and separated from the first electrode, wherein one of the first electrode and the second electrode is electrically connected to the TFT device; and
providing a plurality of LEDs, wherein at least one of the LEDs comprises a third electrode electrically connected to the first electrode and a fourth electrode electrically connected to the second electrode; only one of the first electrode and the third electrode has a magnetic force generator used to generate a magnetic force ranging from 10 gauss to 1000 gauss, and only one of the first electrode and the third electrode has a ferromagnetic material.

16. The assembly method according to claim 15, further comprising:
providing a metal plate having a plurality of recesses and putting the metal plate close to the LEDs placed on a first carrier substrate;
providing a magnetic field generated around the metal plate to pick the LEDs into the recesses; and
shifting the LEDs onto a second carrier substrate;
wherein a pitch between two adjacent ones of the plurality of recesses ranging from 0.01 mm to 100 mm.

17. The assembly method according to claim 16, wherein the process of shifting the LEDs onto the second carrier substrate comprises:
putting the second carrier substrate close to a surface of the at least one of the LEDs departed from the third electrode;
fixing the surface of the at least one of the LEDs on the second carrier substrate by a vacuum-suck; and
stopping or shielding the magnetic field generated around the metal plate.

18. The assembly method according to claim 17, further comprising:
putting the second carrier substrate close to the array substrate to make the third electrode of the at least one of the LEDs connected to one of the first electrode of the array substrate, and to make the fourth electrode of the at least one of the LEDs connected to one of the second electrode of the array substrate; and
stopping the vacuum-suck.

* * * * *